United States Patent [19]
Aronowitz et al.

[11] Patent Number: 5,296,386
[45] Date of Patent: Mar. 22, 1994

[54] METHOD OF PROVIDING LOWER CONTACT RESISTANCE IN MOS TRANSISTOR STRUCTURES

[75] Inventors: Sheldon Aronowitz, San Jose; Courtney Hart, Los Gatos; Court Skinner, East Palo Alto, all of Calif.

[73] Assignee: National Semiconductor Corporation, Santa Clara, Calif.

[21] Appl. No.: 665,465

[22] Filed: Mar. 6, 1991

[51] Int. Cl.$^5$ .......................................... H01L 21/265
[52] U.S. Cl. ........................................ 437/24; 437/34; 437/45; 437/131; 257/281; 257/409; 257/410; 148/DIG. 48; 148/DIG. 82
[58] Field of Search .................... 437/24, 131, 34, 45; 148/DIG. 82, DIG. 48; 357/91, 58; 257/281, 409, 410

[56] References Cited

U.S. PATENT DOCUMENTS

| | | | |
|---|---|---|---|
| 3,725,161 | 3/1971 | Kuper | 437/131 |
| 4,835,112 | 5/1989 | Pfiester et al. | 437/24 |
| 4,837,173 | 6/1989 | Alvis et al. | 437/24 |
| 4,920,076 | 4/1990 | Holland et al. | 437/238 |
| 4,983,536 | 1/1991 | Bulat et al. | 148/DIG. 59 |
| 5,019,882 | 5/1991 | Solomon et al. | 357/58 |

FOREIGN PATENT DOCUMENTS

| | | | |
|---|---|---|---|
| 61-90470 | 5/1986 | Japan | 437/103 |
| 0122176 | 5/1988 | Japan | 437/34 |

OTHER PUBLICATIONS

S. M. Sze, "Physics of semiconductor devices" (John Wiley & Sons, New York, 1981, 2nd Edition.) p. 29.
A. R. Srivatsa et al., "Nature of interfaces and oxidation processes in Ge+-implanted Si" J. Appl. Phys. 65 4028 (1989).
D. Fathy, et al., "Formation of epitaxial layers of GE on Si substrates by GE implantation and oxidation" Appl. Phys. Lett. 51, 1337 (1987).
O. W. Holland, et al., "Novel oxidation process in GE-+-implanted Si and its effect on oxidation kinetics" Appl. PHys. Lett. 51, 520 (1987).
D. K. Sadana, et al., "Germanium implantation into silicon: an alternate pre-amorphization/rapid thermal annealing procedure for shallow junction technology" Mat. Res. Soc. Sym. Proc. 23, 303 (1984).

*Primary Examiner*—Olik Chaudhuri
*Assistant Examiner*—Ramamohan Rao Paladugu
*Attorney, Agent, or Firm*—Limbach & Limbach

[57] ABSTRACT

Germanium is used to significantly enhance the drift mobilities of minority carriers in the channels of N-channel and P-channel metal-oxide-semiconductor (MOS) transistors with silicon substrates. Germanium processing is also used to enhance the source/drain contact conductance for MOS devices. Methods are disclosed for forming the germanium-rich interfacial layer utilizing a germanium implant and wet oxidation or growing a silicon-germanium alloy by molecular beam epitaxy.

2 Claims, 2 Drawing Sheets

METHOD OF PROVIDING LOWER CONTACT RESISTANCE IN MOS TRANSISTOR STRUCTURES

BACKGROUND OF THE INVENTION

1. Field of the Invention

In accordance with the present invention, germanium is used to enhance the performance of silicon-based semiconductor devices. More specifically, germanium is used to create a germanium-rich layer at the silicon surface to provide lower contact resistance in the source and drain regions of MOS transistors.

2. Discussion of the Prior Art

The inherent properties of germanium that are capitalized upon in accordance with the present invention are as follows. First, it is well known that at normal integrated circuit operating temperatures (approx. 27° C.), the drift mobility of electrons and holes in germanium exceeds the drift mobility in silicon by a factor of from 3-10. As discussed by S. N. Sze, "Physics of Semiconductor Devices", John Wiley & Sons, New York, 1981, Second Edition, page 29, the actual drift mobility factor is a function of impurity concentration. Second, the diffusion of silicon through germanium is faster than the diffusion of germanium through silicon. Third, the intrinsic resistivity of germanium (47Ω·cm) is four orders of magnitude smaller than the intrinsic resistivity of silicon. Fourth, as discussed by A. R. Srivatsa et al, "Nature of Interfaces and Oxidation Processes In Germanium Implanted Silicon," Journal of Applied Physics, 65:4028 (1989), the wet oxidation of silicon with a germanium implant present can be used to form epitaxial layers of germanium. As disclosed by D. Fathy et al, "Formation of Epitaxial Layers of Germanium on Silicon Substrates by Germanium Implantation and Oxidation", Applied Physics Letter 51:1337 (1987), these germanium epitaxial layers can be formed without forming germanium oxide layers.

SUMMARY OF THE INVENTION

The phenomenon that wet oxidation of silicon wafers implanted with high dose, low energy germanium results in segregation of the germanium in the silicon along with formation of an almost pure germanium layer in the interfacial region is used to create MOS transistor structures with lower contact resistance in the source and drain regions.

Alternatively, an epitaxial layer of silicon-germanium alloy of the desired germanium purity may be formed in the interfacial region to lower contact resistance.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1A:
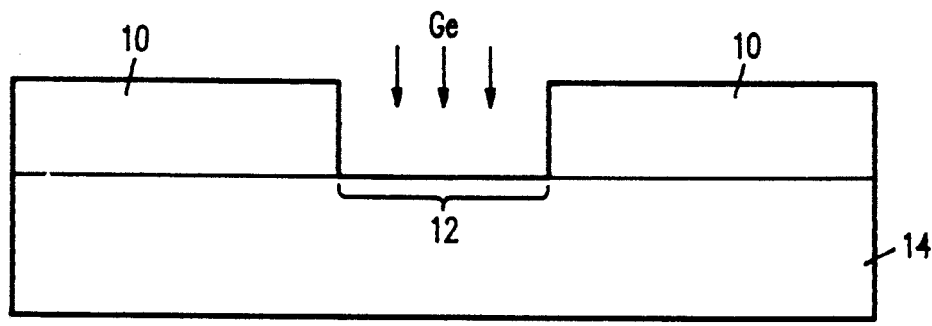
FIGS. 1A-1C are cross-sectional drawings illustrating introduction of a germanium layer into the channel region of an MOS device.
Figure 1B:
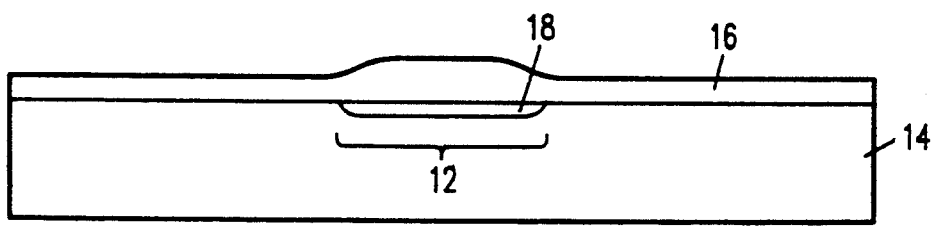
Figure 1C:
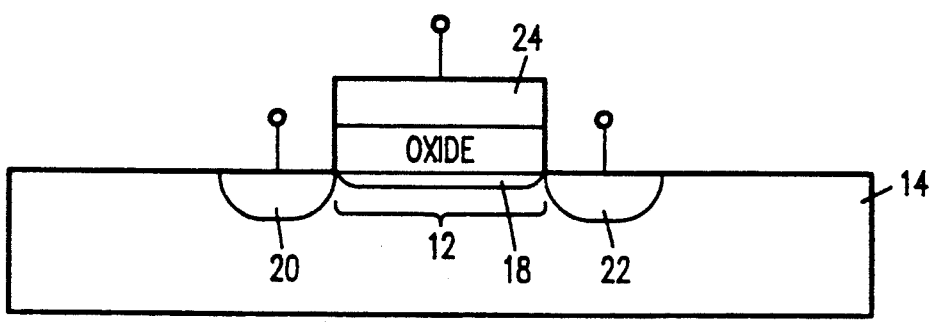

FIGS. 1A-1C show a semiconductor processing sequence which results in introduction of a germanium-rich layer into the channel of an MOS transistor structure near the interfacial region to enhance the mobility of minority carriers.

As shown in FIG. 1A, a layer of photoresist 10 is deposited and patterned by conventional methods to define a channel region 12 in a silicon substrate 14. Germanium, at a dose of $2 \times 10^{16} Ge/cm^2$ and an energy of 40 KEV, is then implanted into the channel region 12.

As shown in FIG. 1B, after the photoresist 10 has been stripped, a wet oxidation step is performed at 900° C. for 30-60 minutes to grow oxide layer 16 on the silicon and creating a germanium-rich layer 18 at the interfacial region of the silicon substrate 14. (Those skilled in the art will appreciate that while FIG. 1B shows a distinct difference in thickness in the differential oxide layer 16 overlying the germanium-rich layer 18 for illustrative purposes, the actual thickness of the oxide overlying the germanium-rich layer 18 will be only several hundred Angstroms greater than the remainder of the oxide layer 16.) The length of the wet oxidation step should be sufficient to achieve a germanium concentration of at least 95% in the layer 18. However, the oxidation step should be as short as possible, since, at a point, germanium diffusion will begin to occur from the germanium-rich layer 18 to the substrate silicon 14.

As shown in FIG. 1C, the oxide layer 16 is then stripped and subsequent treatment of the silicon substrate 14 is essentially in accordance with standard integrated circuit fabrication techniques to define an MOS transistor structure have a source region 20, drain region 22, and gate region 24 overlying the channel region 12.

As disclosed by O. W. Holland et al, "Novel Oxidation Process in Germanium Implanted Silicon and its Effect on Oxidation Kinetics", Applied Physics Letter 51:520 (1987), the use of wet oxidation steps will involve enhanced oxidation rates because of the presence of germanium in the silicon substrate 14. This enhancement permits shorter oxidation times at lower temperatures which reduces undesired dopant diffusion.

While the effect of germanium on the dry oxidation rate has not been carefully examined, it is expected that some enhancement of the oxidation rate will occur due to the presence of a germanium layer, since barriers to bond breaking are lower than in pure silicon.

As is well known, the approximate ratio of drift mobilities for electrons and holes in intrinsic germanium versus intrinsic silicon equals $$\mu_n(Ge)/\mu_n(Si) \approx 2.6,$$

$$\mu_p(Ge)/\mu_p(Si) \approx 4.2.$$

In the presence of impurities, the drift mobility ratio is changed. For example, in the presence of an impurity concentration of $10^{17} cm^{-3}$, $$\mu_n(Ge)/\mu_n(Si) \approx 3.7,$$

$\mu_p(\text{Ge})/\mu_p(\text{Si}) \approx 3.0$.

These ratios show that, while the presence of dopants will affect the mobilities, drift mobilities remain significantly higher in germanium. Consequently, inversion in the channel for either N-channel or P-channel MOS transistors will result in significantly increased drift mobilities of the minority carriers due to the presence of the germanium layer 18.

Figure 2A:
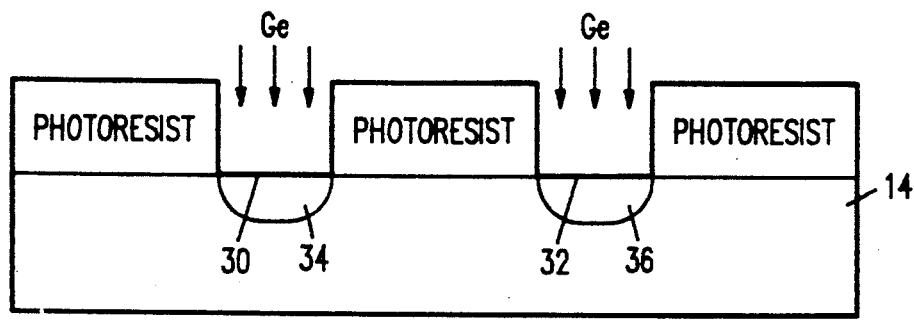
FIGS. 2A-2B are cross-sectional drawings illustrating introduction of a germanium layer into the source/drain regions of an MOS device in accordance with the present invention.
Figure 2B:
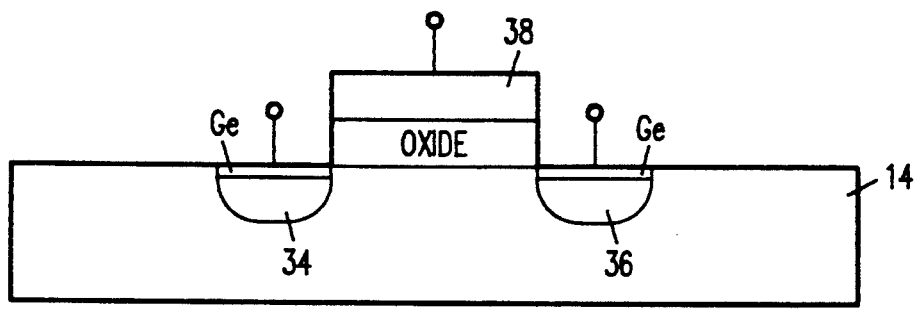

FIGS. 2A and 2B show a semiconductor processing sequence in which the above-described properties of germanium in silicon are utilized to provide lower contact resistance in the source and drain regions of MOS transistors.

As shown in FIG. 2A, a layer of photoresist is deposited and patterned according to conventional methods to define surface regions 30 and 32 in which respective source and drain regions 34 and 36 are formed by introduction of appropriate dopants. Germanium is then implanted in accordance with the dosage and implant energy parameters cited above.

As shown in FIG. 2B, following a wet oxidation step which results in the formation of a germanium-rich layer at the interfacial region, the oxide is stripped and processing proceeds in a conventional manner to define an MOS transistor structure that includes source region 34, drain region 36 and gate electrode 38.

The concentration of germanium in the germanium-rich interfacial region is not so critical as in the case of the "channel region" embodiment described above, but should be at least 70%.

The advantages of the presence of a thin germanium layer in the source/drain regions at the contact interface are at least twofold. First, additional wet oxidation can be used to grow a source/drain oxide which, when etched, produces a very smooth interface. This surface preparation enables greater contact area with a metal plug. Moreover, the germanium is a low resistivity material. Second, the germanium layer provides silicide contact resistance lowering. Since silicon diffuses rapidly through germanium, it is expected that the silicide/germanium-silicon interface will be smoother than if no germanium layer were present. Detrimental effects that might occur if dopant diffusion from the silicon into the forming silicide were extensive (increased contact resistance) would be compensated for by the low resistivity germanium. All of this leads to enhanced contact conductance in the source/drain regions.

Figure 3A:
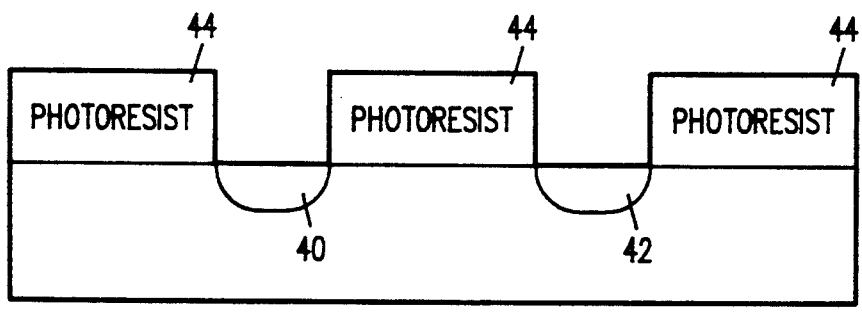
FIGS. 3A-3B are cross-sectional drawings illustrating an alternative method of introducing a germanium layer into the source/drain regions of an MOS device in accordance with the present invention.
Figure 3B:
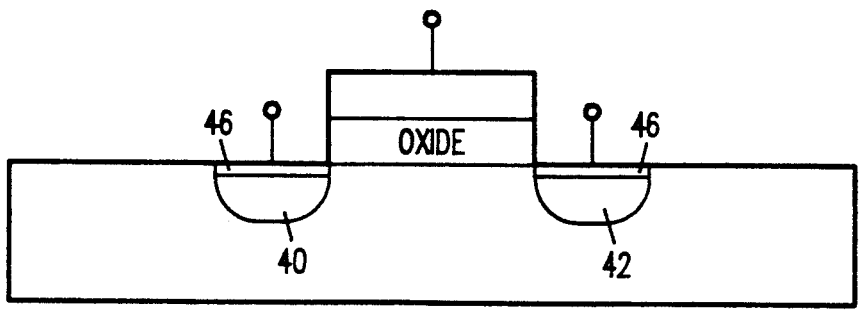

As shown in FIGS. 3A–3B, formation of a layer of silicon-germanium alloy of a desired germanium purity, to enhance channel mobility and/or lower contact resistance as described above, may also be achieved without wet oxidation utilizing molecular beam epitaxy (MBE).

Referring to FIG. 3A, in the context of source and drain regions 40 and 42, respectively, one possible MBE technique would entail masking the source and drain regions 40, 42 with photoresist 44 and then notching these regions to a desired depth (e.g. 0.25 microns) utilizing a quick plasma etch. An epitaxial silicon-germanium alloy 46 is then deposited in the notch by any desired conventional MBE technique to obtain a desired Si:Ge mole-fraction ratio ($Si_{1-x}Ge_x$). The $Si_{1-x}Ge_x$ epitaxial layer 46 is then etched back to obtain a desired surface profile, as shown in FIG. 3B. The MOS device structure is then completed in the conventional manner by forming gate oxide 48 and overlying gate electrode 50. As in the case of the wet oxidation procedure described above, the germanium concentration in the alloy 46 should be at least 70%.

Those skilled in the art will appreciate that the MBE technique described above for enhancing contact resistance in source/drain regions is also applicable to enhancement of drift mobility in the channel region of MOS devices. As with the wet oxidation technique described above for accomplishing this end, the germanium concentration in the germanium-rich interfacial layer of the channel should be at least 95%.

It should be understood that various alternatives to the embodiment of the invention described herein may be employed in practicing the invention. It is intended that the following claims define the scope of the invention and that methods within the scope of these claims and their equivalents be covered thereby.

What is claimed is:

1. A method of providing lower contact resistance in the source ad drain regions of an MOS transistor, the method comprising the sequential steps of:
   (a) defining source and drain regions in a silicon substrate, the source and drain regions being spaced apart to define a channel region therebetween;
   (b) after defining the source and drain regions forming an epitaxial layer of silicon-germanium alloy at the surface of the source and drain regions; and
   (c) after forming an epitaxial layer forming an MOS transistor structure comprising the source and drain regions and a gate electrode overlying the channel region and separated therefrom by a layer of dielectric material.

2. A method as in claim 1 wherein the silicon-germanium alloy comprises at least 70% germanium.

* * * * *